United States Patent
Keal

(10) Patent No.: US 8,577,640 B2
(45) Date of Patent: Nov. 5, 2013

(54) MAGNETOMETER BIAS AND ANOMALY DETECTOR

(75) Inventor: William Kerry Keal, Santa Clara, CA (US)

(73) Assignee: Invensense, Inc., San Jose, CA (US)

( * ) Notice: Subject to any disclaimer, the term of this patent is extended or adjusted under 35 U.S.C. 154(b) by 0 days.

(21) Appl. No.: 13/572,441

(22) Filed: Aug. 10, 2012

(65) Prior Publication Data

US 2013/0046489 A1    Feb. 21, 2013

Related U.S. Application Data

(60) Provisional application No. 61/524,703, filed on Aug. 17, 2011, provisional application No. 61/590,924, filed on Jan. 26, 2012.

(51) Int. Cl.
*G01C 19/00* (2013.01)

(52) U.S. Cl.
USPC ............. 702/104; 702/57; 702/105; 702/189; 702/193; 702/194; 702/195; 702/196; 324/244; 324/202

(58) Field of Classification Search
USPC ........... 702/57, 104, 105, 189, 193, 194, 195, 702/196; 324/244, 202
See application file for complete search history.

(56) References Cited

U.S. PATENT DOCUMENTS

| | | | |
|---|---|---|---|
| 6,758,080 B1 | 7/2004 | Ragan et al. | |
| 7,835,879 B2 * | 11/2010 | Vocali et al. | 702/92 |
| 2003/0167121 A1 | 9/2003 | Ockerse et al. | |
| 2004/0236510 A1 | 11/2004 | Ockerse et al. | |
| 2005/0251328 A1 | 11/2005 | Merwe et al. | |
| 2005/0283988 A1 | 12/2005 | Sato et al. | |
| 2007/0055468 A1 | 3/2007 | Pylvanainen | |
| 2007/0086103 A1 * | 4/2007 | Handa | 360/43 |
| 2007/0288166 A1 * | 12/2007 | Ockerse et al. | 701/224 |
| 2009/0070057 A1 * | 3/2009 | Hirobe et al. | 702/92 |
| 2009/0089001 A1 | 4/2009 | Lin | |
| 2009/0157341 A1 | 6/2009 | Cheung | |
| 2009/0254294 A1 | 10/2009 | Dutta | |
| 2010/0292943 A1 | 11/2010 | Minor et al. | |
| 2010/0312509 A1 | 12/2010 | Patel et al. | |
| 2011/0077889 A1 | 3/2011 | Vogt | |
| 2011/0106477 A1 | 5/2011 | Brunner | |
| 2011/0178707 A1 | 7/2011 | Sachs et al. | |

FOREIGN PATENT DOCUMENTS

WO    WO 00/55652    9/2000

* cited by examiner

*Primary Examiner* — Sujoy Kundu
*Assistant Examiner* — Hyun Park
(74) *Attorney, Agent, or Firm* — Sawyer Law Group, P.C.

(57) ABSTRACT

The computer implemented method, system or computer program product comprises collecting magnetometer data from the device; and calculating a center of a shape of the magnetometer data as a result of minimization. The minimization of calculating the center of the shape further comprises calculating a plurality of running sums of the magnetometer data; storing the plurality of running sums; storing a count of the number of terms in each of the running sums; and calculating the center of the shape and setting the estimated magnetometer bias to the center of the shape. The radius of the sphere is calculated to ensure accuracy in the estimator of the magnetometer bias.

30 Claims, 5 Drawing Sheets

MAGNETOMETER BIAS AND ANOMALY DETECTOR

CROSS-REFERENCE TO RELATED APPLICATIONS

This application claims benefit under 35 USC 119(e) of Provisional Application Ser. No. 61/524,703, filed on Aug. 17, 2011, entitled "MAGNETOMETER BIAS AND ANOMALY DETECTOR," and is related to U.S. Provisional Patent Application No. 61/590,924, filed Jan. 26, 2012, entitled "IN-USE AUTOMATIC CALIBRATION METHODOLOGY FOR ACCELEROMETERS (AND/OR MAGNETOMETERS) IN MOBILE DEVICES," all of which are incorporated herein by reference in their entireties.

FIELD OF THE INVENTION

The present invention relates generally to devices that utilize magnetometers and more specifically to detecting magnetometer bias in such devices.

BACKGROUND OF THE INVENTION

Traditional methods of determining magnetometer bias do not meet all of the features of being robust to noise, closed form, low memory and fast convergence. Accordingly what is needed is a system and method to address these features. The system and method should be adaptable, easily implemented and cost effective. The present invention addresses such a need.

SUMMARY OF THE INVENTION

A computer implemented method, system or computer program product of estimating magnetometer bias and axis sensitivity for a device is disclosed. The computer implemented method, system or computer program product comprises collecting magnetometer data from the device; and calculating a center of a shape of the magnetometer data as a result of minimization. The minimization of calculating the center of the shape further comprises calculating a plurality of running sums of the magnetometer data; storing the plurality of running sums; storing a count of the number of terms in each of the running sums; and calculating the center of the shape and setting the estimated magnetometer bias to the center of the shape.

The present invention provides a fast closed form method to determine magnetometer bias which is robust with noise measurements. The present invention also provides methods to evaluate convergence of bias.

DETAILED DESCRIPTION

The present invention relates generally to devices that utilize magnetometers and more specifically to detecting magnetometer bias in such devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

To accurately determine magnetometer bias several assumptions must be made. It is assumed that relative to the sensor the earth's magnetic field is constant and there is a small amount of magnetic disturbance interfering with the sensors. It is also assumed that the magnetometer sensors sensitivity is equal on each of the three axes. With these three assumptions, as a user moves a magnetometer sensor the shape of the measurements will start to appear spherical. From a geometric standpoint the center of the sphere is then found, the center of the sphere represents the magnetometer bias. The present invention is directed to determining the magnetometer bias to ensure the device is in its proper orientation. To describe the features of the present invention in more detail refer now to the following description in conjunction with the accompanying figures.

Figure 1:
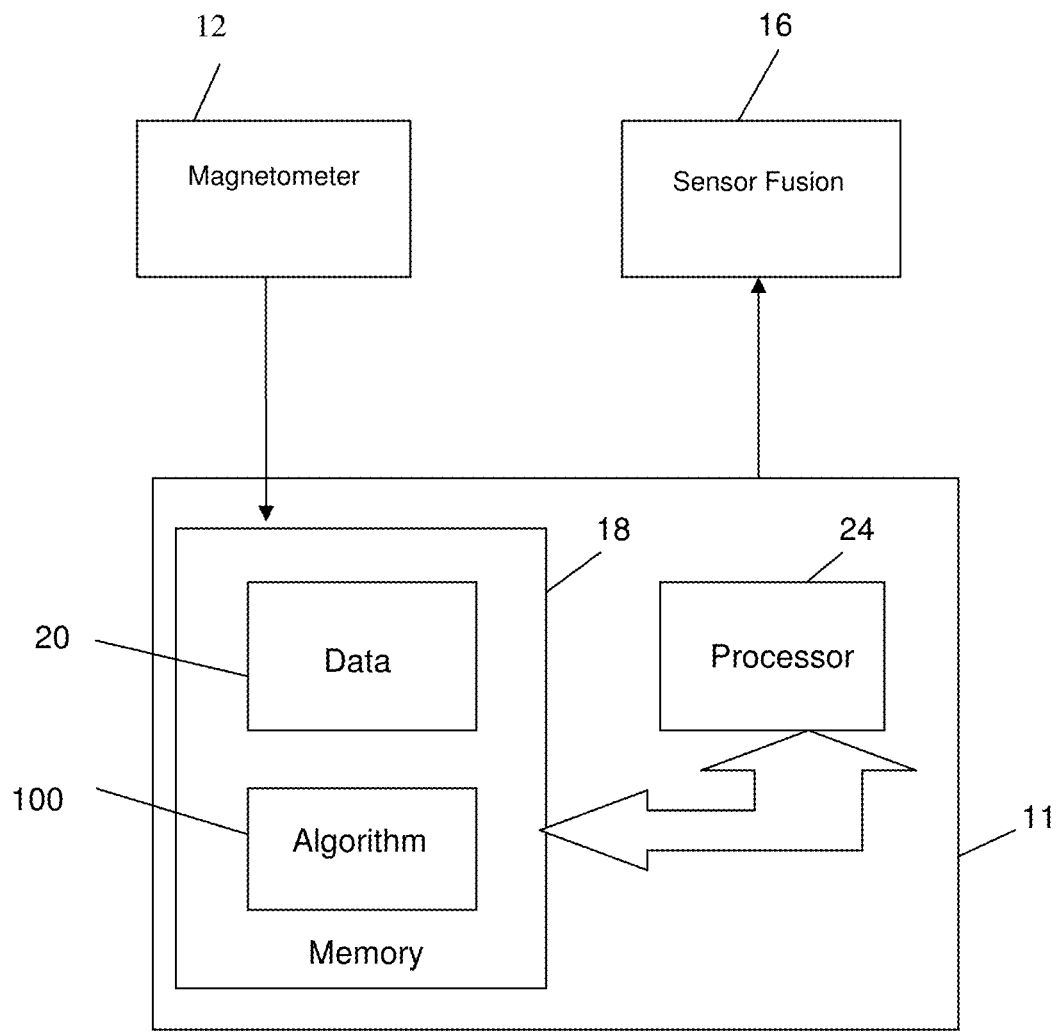
FIG. 1 is a block diagram of a system that utilizes a magnetometer detection algorithm in accordance with an embodiment.

FIG. 1 is a block diagram of a system 10 that utilizes a magnetometer estimator algorithm 100 in accordance with an embodiment. The system 10 includes a device 11. The device 11 may include any type of mobile device including but not limited to, a cell phone, a tablet PC, or other type of portable electronic device. The device 11 receives input data from a magnetometer 12. The device 11 includes memory 18 for storing data. Data 20 stores data from the magnetometer 12. Memory 18 also includes a bias detector algorithm 100 in accordance with the present invention. A processor 24 executes the algorithm 100 which operates on the data received from magnetometer 12. The processor 24 provides the executed data to sensor fusion system 16. The sensor fusion system 16 provides orientation information of the device.

Figure 2:
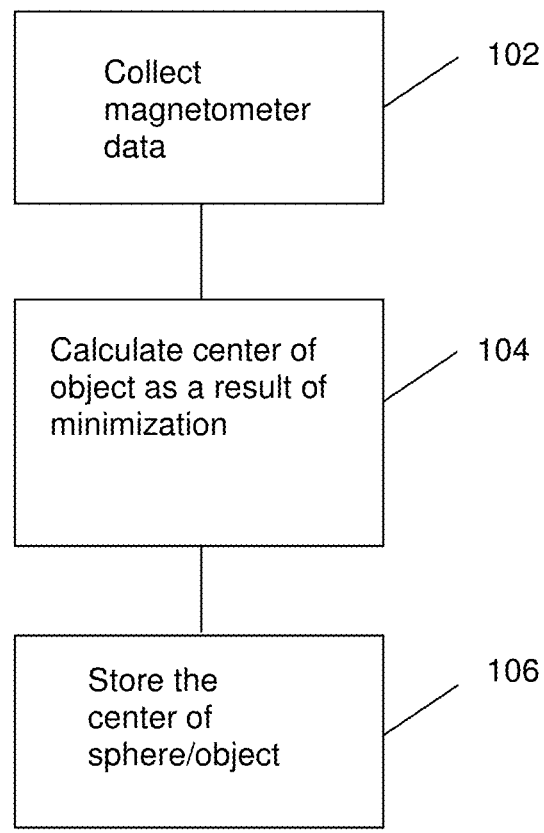
FIG. 2 is a flow chart which illustrates generally detecting magnetometer bias in the device.

FIG. 2 is a flow chart which illustrates generally detecting magnetometer bias in the device. As is seen, first magnetometer data is collected, via step 102. Next, the center of an object is calculated as a result of minimization, via step 104. The center of the object is then stored in the memory, via step 106. The object could be a sphere or ellipsoid depending on the device movement.

A system and method in accordance with the present invention estimates the bias for a magnetometer sensor with three degrees of freedom. A system and method in accordance with the present invention is utilized to recognize magnetic disturbances both before and after a bias has converged.

A system that utilizes a magnetometer bias estimation algorithm in accordance with the present invention can take the form of an entirely hardware implementation, an entirely software implementation, or an implementation containing both hardware and software elements. In one implementation, the magnetometer bias estimation algorithm is implemented in software, which includes, but is not limited to, application software, firmware, resident software, microcode, etc.

Furthermore, the magnetometer bias estimation procedure can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include DVD, compact disk-read-only memory (CD-ROM), and compact disk-read/write (CD-R/W). To describe the features of the present invention in more detail, refer now to the following description in conjunction with the accompanying figures.

Figure 3:
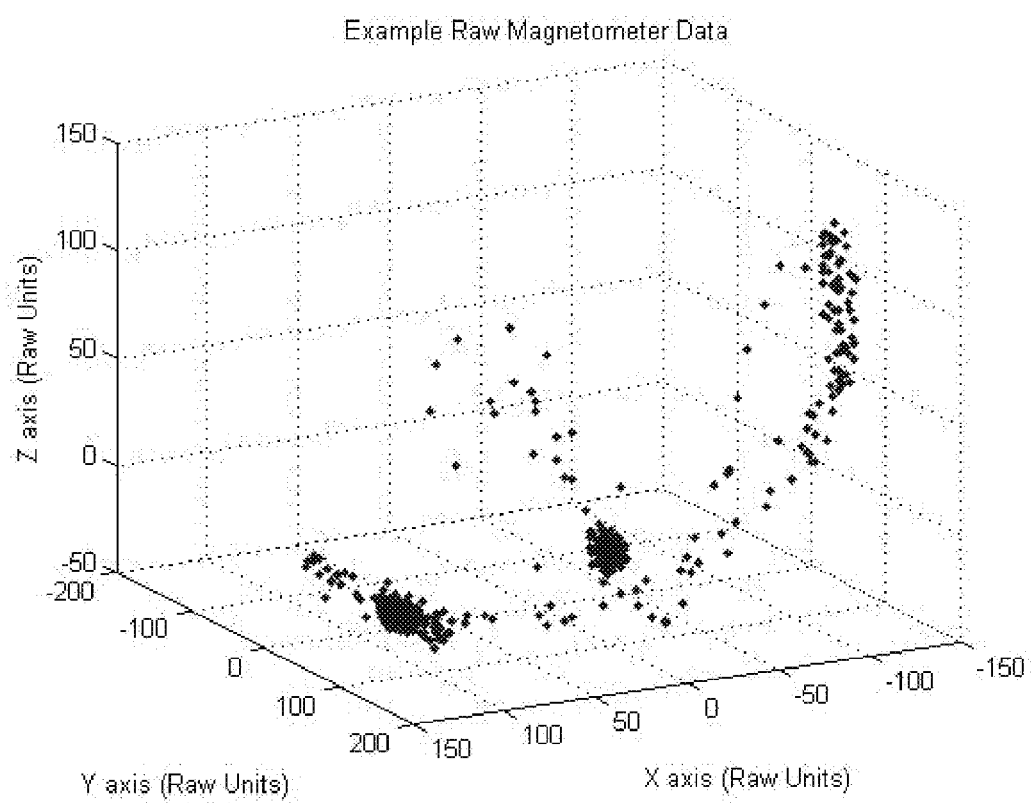
FIG. 3 is an example of a location of raw magnetometer data.

FIG. 3 is an example of raw magnetometer data. FIG. 3 illustrates that as magnetometer data is being gathered, a spherical shape of the data is starting to form. What is desired is, which has been described before, is to determine the center of an object such as a sphere so that the magnetometer bias can be determined. To describe determining the center of the sphere of the magnetometer data refer now to the following.

Center of the Sphere

Figure 5:
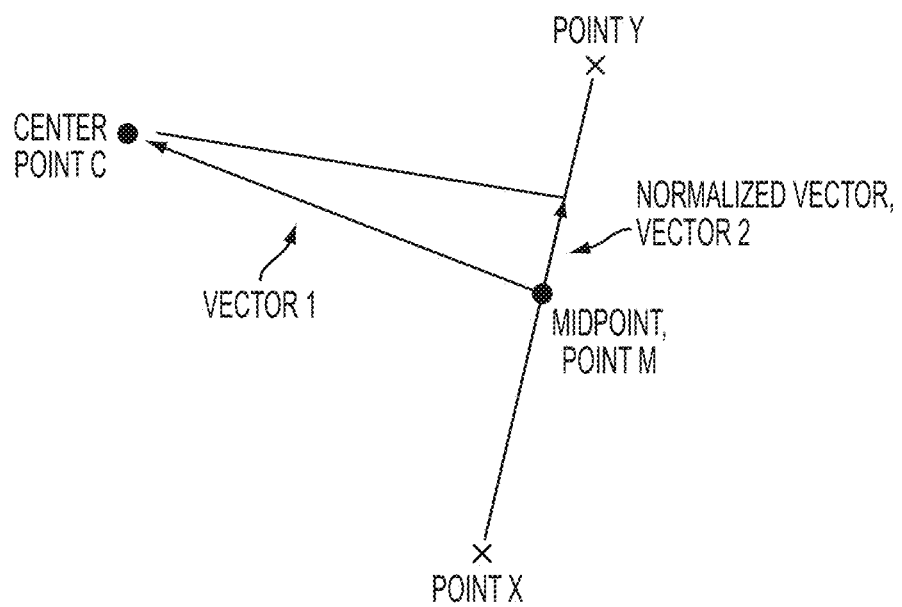
FIG. 5 is an example of computing the center point of a sphere.

As shown in FIG. 5, given a pair of points, X and Y, it is possible to compute the dot product of the vector from the midpoint of the pair of points to the center of the sphere (Vector 1), and the normalized vector between the two points (Vector 2). If there is no error and both points (X and Y) lie on the sphere with Point C being the center of the sphere, the dot product value will be zero. Another interpretation of the dot product value is it is the distance between the center of the sphere and the plane created by the midpoint of the two points and the normal vector created by the two points. The following S' equation represents squaring the dot product for all combinations of points:

$$S' = \sum_{n=1}^{N-1} \sum_{m=n+1}^{N} \frac{\left[ \left[a - \frac{(x_m+x_n)}{2}\right] \cdot (x_m - x_n) + \left[b - \frac{(y_m+y_n)}{2}\right] \cdot \right]^2}{(x_m - x_n)^2 + (y_m - y_n)^2 + (z_m - z_n)^2} \quad (1)$$

where a, b, c represents the center of the sphere, and x, y, z represents the magnetometer measurements. There are N number of magnetometer measurements.

Next, because the data points have errors on them, the equation will be weighted by how far apart the pairs of points are. The result will give:

$$S = \sum_{n=1}^{N-1} \sum_{m=n+1}^{N} \left[ \left[a - \frac{(x_m+x_n)}{2}\right] \cdot (x_m - x_n) + \left[b - \frac{(y_m+y_n)}{2}\right] \cdot (y_m - y_n) + \left[c - \frac{(z_m+z_n)}{2}\right] \cdot (z_m - z_n) \right]^2 \quad (2)$$

The Equation (2) can be minimized by taking the partial derivatives and setting the partial derivatives to zero. Taking partial derivatives of S with respect to a, b, c and setting it to zero gives the set of equations (3):

$$\begin{cases} \sum_{n=1}^{N-1} \sum_{m=n+1}^{N} \left[ \begin{array}{l} -2 \cdot (x_m - x_n) \cdot \left[ (x_m - x_n) \cdot \left(\frac{x_m}{2} - a + \frac{x_n}{2}\right) + (y_m - y_n) \cdot \right. \\ \left. \left(\frac{y_m}{2} - b + \frac{y_n}{2}\right) + (z_m - z_n) \cdot \left(\frac{z_m}{2} - c + \frac{z_n}{2}\right) \right] \end{array} \right] = 0 \\ \sum_{n=1}^{N-1} \sum_{m=n+1}^{N} \left[ \begin{array}{l} -2 \cdot (y_m - y_n) \cdot \left[ (x_m - x_n) \cdot \left(\frac{x_m}{2} - a + \frac{x_n}{2}\right) + (y_m - y_n) \cdot \right. \\ \left. \left(\frac{y_m}{2} - b + \frac{y_n}{2}\right) + (z_m - z_n) \cdot \left(\frac{z_m}{2} - c + \frac{z_n}{2}\right) \right] \end{array} \right] = 0 \\ \sum_{n=1}^{N-1} \sum_{m=n+1}^{N} \left[ \begin{array}{l} -2 \cdot (z_m - z_n) \cdot \left[ (x_m - x_n) \cdot \left(\frac{x_m}{2} - a + \frac{x_n}{2}\right) + (y_m - y_n) \cdot \right. \\ \left. \left(\frac{y_m}{2} - b + \frac{y_n}{2}\right) + (z_m - z_n) \cdot \left(\frac{z_m}{2} - c + \frac{z_n}{2}\right) \right] \end{array} \right] = 0 \end{cases} \quad (3)$$

To reduce the double sums to single sums the following identity is used:

$$\sum_{i=1}^{N-1} \sum_{j=i+1}^{N} [(b_j - b_i) \cdot (a_j - a_i)] = \left[N \cdot \sum_{i=1}^{N} (b_i \cdot a_i)\right] - \left[\sum_{i=1}^{N} (b_i)\right] \cdot \left[\sum_{i=1}^{N} (a_i)\right] \quad (4)$$

The following terms result:

$$Am = N \cdot \sum_{n=1}^{N} (x_n)^2 - \left(\sum_{n=1}^{N} x_n\right)^2 \quad (5)$$

$$Bm = N \cdot \sum_{n=1}^{N} (y_n)^2 - \left(\sum_{n=1}^{N} y_n\right)^2$$

$$Cm = N \cdot \sum_{n=1}^{N} (z_n)^2 - \left(\sum_{n=1}^{N} z_n\right)^2$$

$$Dm = N \cdot \sum_{n=1}^{N} (x_n \cdot y_n) - \sum_{n=1}^{N} x_n \cdot \sum_{n=1}^{N} y_n$$

$$Em = N \cdot \sum_{n=1}^{N} (x_n \cdot z_n) - \sum_{n=1}^{N} x_n \cdot \sum_{n=1}^{N} z_n$$

$$Fm = N \cdot \sum_{n=1}^{N} (y_n \cdot z_n) - \sum_{n=1}^{N} y_n \cdot \sum_{n=1}^{N} z_n$$

$$Gm = \frac{1}{2} \cdot \sum_{n=1}^{N-1} \sum_{m=n+1}^{N} [(x_m - x_n) \cdot [(x_m)^2 - (x_n)^2 + (y_m)^2 - (y_n)^2 + (z_m)^2 - (z_n)^2]]$$

$$Hm = \frac{1}{2} \cdot \sum_{n=1}^{N-1} \sum_{m=n+1}^{N} [(y_m - y_n) \cdot [(x_m)^2 - (x_n)^2 + (y_m)^2 - (y_n)^2 + (z_m)^2 - (z_n)^2]]$$

$$Im = \frac{1}{2} \cdot \sum_{n=1}^{N-1} \sum_{m=n+1}^{N} [(z_m - z_n) \cdot [(x_m)^2 - (x_n)^2 + (y_m)^2 - (y_n)^2 + (z_m)^2 - (z_n)^2]]$$

Which is equivalent to:

$$Gm = \frac{1}{2} \cdot \sum_{n=1}^{N-1} \sum_{m=n+1}^{N} \begin{bmatrix} (x_m - x_n) \cdot [(x_m)^2 - (x_n)^2] + (x_m - x_n) \cdot \\ [(y_m)^2 - (y_n)^2] + (x_m - x_n) \cdot [(z_m)^2 - (z_n)^2] \end{bmatrix}$$

$$Hm = \frac{1}{2} \cdot \sum_{n=1}^{N-1} \sum_{m=n+1}^{N} \begin{bmatrix} (y_m - y_n) \cdot [(x_m)^2 - (x_n)^2] + (y_m - y_n) \cdot \\ [(y_m)^2 - (y_n)^2] + (y_m - y_n) \cdot [(z_m)^2 - (z_n)^2] \end{bmatrix}$$

$$Im = \frac{1}{2} \cdot \sum_{n=1}^{N-1} \sum_{m=n+1}^{N} \begin{bmatrix} (z_m - z_n) \cdot [(x_m)^2 - (x_n)^2] + (z_m - z_n) \cdot \\ [(y_m)^2 - (y_n)^2] + (z_m - z_n) \cdot [(z_m)^2 - (z_n)^2] \end{bmatrix}$$

(6)

Reducing to single sums as $$Gm = \frac{1}{2} \cdot \begin{bmatrix} N \cdot \sum_{n=1}^{N} (x_n)^3 + N \cdot \sum_{n=1}^{N} [x_n \cdot (y_n)^2] + N \cdot \\ \sum_{n=1}^{N} [x_n \cdot (z_n)^2] - \sum_{n=1}^{N} x_n \cdot \begin{bmatrix} \sum_{n=1}^{N} (x_n)^2 + \\ \sum_{n=1}^{N} (y_n)^2 + \sum_{n=1}^{N} (z_n)^2 \end{bmatrix} \end{bmatrix}$$

$$Hm = \frac{1}{2} \cdot \begin{bmatrix} N \cdot \sum_{n=1}^{N} [y_n \cdot (x_n)^2] + N \cdot \sum_{n=1}^{N} (y_n)^3 + N \cdot \\ \sum_{n=1}^{N} [y_n \cdot (z_n)^2] - \sum_{n=1}^{N} y_n \cdot \begin{bmatrix} \sum_{n=1}^{N} (x_n)^2 + \\ \sum_{n=1}^{N} (y_n)^2 + \sum_{n=1}^{N} (z_n)^2 \end{bmatrix} \end{bmatrix}$$

$$Im = \frac{1}{2} \cdot \begin{bmatrix} N \cdot \sum_{n=1}^{N} [z_n \cdot (x_n)^2] + N \cdot \sum_{n=1}^{N} [z_n \cdot (y_n)^2] + N \cdot \\ \sum_{n=1}^{N} (z_n)^3 - \sum_{n=1}^{N} z_n \cdot \begin{bmatrix} \sum_{n=1}^{N} (x_n)^2 + \\ \sum_{n=1}^{N} (y_n)^2 + \sum_{n=1}^{N} (z_n)^2 \end{bmatrix} \end{bmatrix}$$

(7)

To solve the three system of equations, they can be rewritten in matrix form as:

$$\begin{pmatrix} Am & Dm & Em \\ Dm & Bm & Fm \\ Em & Fm & Cm \end{pmatrix} \cdot \begin{pmatrix} a \\ b \\ c \end{pmatrix} = \begin{pmatrix} Gm \\ Hm \\ Im \end{pmatrix}$$

(8)

$$\begin{pmatrix} a \\ b \\ c \end{pmatrix} = \begin{bmatrix} \dfrac{Em \cdot (Bm \cdot Im - Fm \cdot Hm) + Fm^2 \cdot Gm - Bm \cdot Cm \cdot Gm + Cm \cdot Dm \cdot Hm - Dm \cdot Fm \cdot Im}{Cm \cdot Dm^2 - 2 \cdot Dm \cdot Em \cdot Fm + Bm \cdot Em^2 + Am \cdot Fm^2 - Am \cdot Bm \cdot Cm} \\ \dfrac{Fm \cdot (Am \cdot Im - Em \cdot Gm) + Em^2 \cdot Hm - Am \cdot Cm \cdot Hm + Cm \cdot Dm \cdot Gm - Dm \cdot Em \cdot Im}{Cm \cdot Dm^2 - 2 \cdot Dm \cdot Em \cdot Fm + Bm \cdot Em^2 + Am \cdot Fm^2 - Am \cdot Bm \cdot Cm} \\ \dfrac{Fm \cdot (Am \cdot Hm - Dm \cdot Gm) + Dm^2 \cdot Im - Am \cdot Bm \cdot Im + Bm \cdot Em \cdot Gm - Dm \cdot Em \cdot Hm}{Cm \cdot Dm^2 - 2 \cdot Dm \cdot Em \cdot Fm + Bm \cdot Em^2 + Am \cdot Fm^2 - Am \cdot Bm \cdot Cm} \end{bmatrix}$$

One advantage of the above equations (8) is that while maintaining usage of all the historical data, only the running summations need to be stored. Since only the running summations need to be stored memory resources utilized are reduced which is always an advantage on an embedded resource.

To maintain numerical stability and to give more weight to newer data to handle cases of the magnetometer bias slowly changing, the summation parameters and the number of terms can all be divided by a constant. Another method to add numerical stability is to only add data to sections that have observed fewer orientations. Running sums are computed $$Q_x = \left( P_{x,n-1} + \frac{(x_n - a)}{\sqrt{(x_n - a)^2 + (y_n - b)^2 + (z_n - c)^2}} \right) * \left( \frac{n-1}{n} \right)$$

Equation 8a $$Q_y = \left( P_{y,n-1} + \frac{(y_n - a)}{\sqrt{(x_n - a)^2 + (y_n - b)^2 + (z_n - c)^2}} \right) * \left( \frac{n-1}{n} \right)$$

$$Q_z = \left( P_{z,n-1} + \frac{(z_n - a)}{\sqrt{(x_n - a)^2 + (y_n - b)^2 + (z_n - c)^2}} \right) * \left( \frac{n-1}{n} \right)$$

With initialization shown in Equation 8b for the first sample $$P_{x,1} = \frac{(x_1 - a)}{\sqrt{(x_1 - a)^2 + (y_1 - b)^2 + (z_1 - c)^2}}$$

Equation 8b $$P_{y,1} = \frac{(y_1 - a)}{\sqrt{(x_1 - a)^2 + (y_1 - b)^2 + (z_1 - c)^2}}$$

$$P_{z,1} = \frac{(z_1 - a)}{\sqrt{(x_1 - a)^2 + (y_1 - b)^2 + (z_1 - c)^2}}$$

Another way to interpret Equation 8a is the normalized average of sensor data. If the absolute value of Q terms in Equation 8a are below a threshold, then the compass sample ($x_n$, $y_n$, $z_n$) will be added to the overall solution in equations 5, 6, 7 and 8. One implementation of the logic is shown below in Equation 8c. Other deviations from Equation 8c that would work would be to allow 1 or more of the comparisons to pass the threshold and to use multiple thresholds. For instance, an acceptable method would be to have a lower threshold for at least 1 comparison to be true and a higher threshold all 3 comparisons to be true before allowing the update to equations 5, 6, 7, 8.

If $\|Q_x\| < T$ and $\|Q_y\| < T$ and $\|Q_z\| < T$ then $P_{x,n} = Q_x$ $P_{y,n} = Q_y$ $P_{s,n} = Q_z$ Equation 8c Update to equations 5, 6, 7, 8

Figure 4:
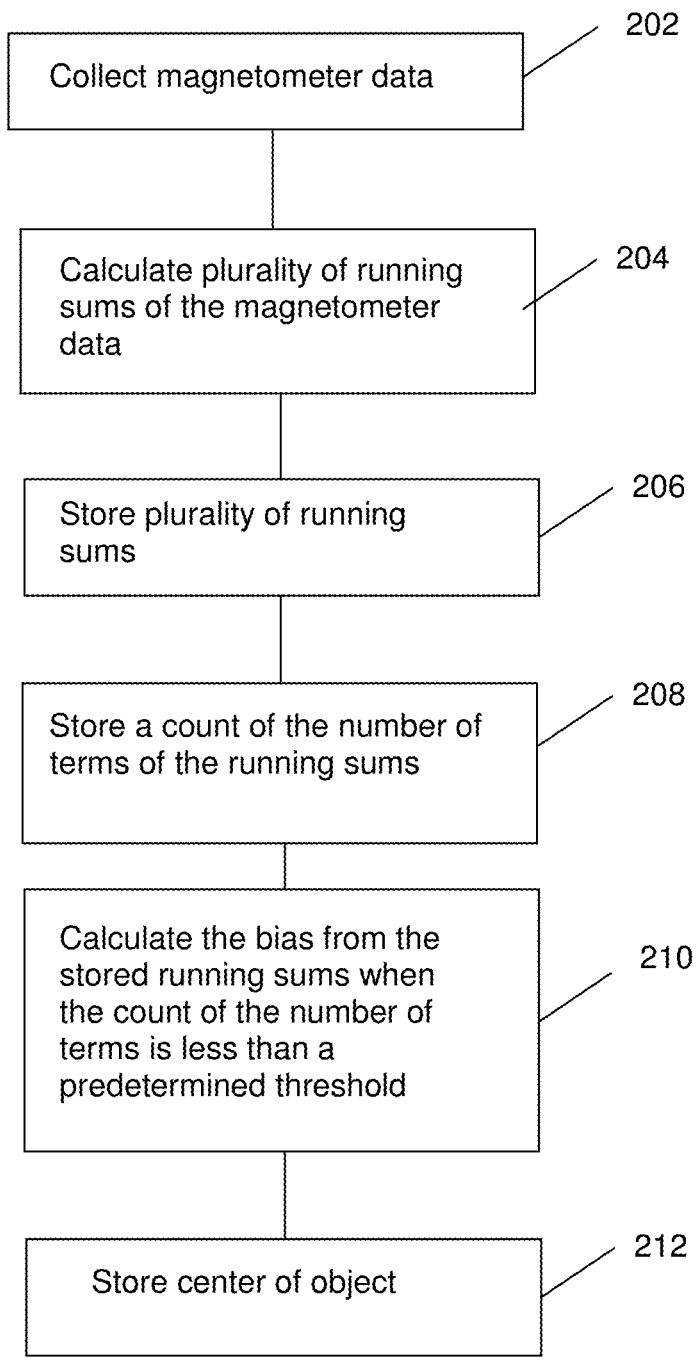
FIG. 4 is a flow chart for estimating a bias in accordance with an embodiment.

FIG. 4 is a flow chart for estimating a bias in accordance with an embodiment. First, magnetometer data is collected, via step 202. The center of a shape of the magnetometer data is then calculated as a result of minimization. To provide the minimization of calculating the center of the shape further includes the steps described below. First a plurality of running sums of the magnetometer data are calculated, via step 204. In the above embodiment, the plurality of running sums comprise running sums of the magnetometer data, the square of the magnetometer data, the cube of the magnetometer data and the cross product of the magnetometer data. Thereafter, the plurality of running sums is stored in memory, via step 206. A count of the number of times that the plurality of running sums calculated is stored, via step 208. Then, the estimated magnetometer bias is calculated from the stored running sums when the count is less than a predetermined threshold, via step 210. Finally, a center of the object is determined from the estimated magnetometer bias, via step 212.

Radius of Sphere

It is also desirable to compute the radius of the sphere to ensure accuracy in the estimator of the bias. There are several methods to compute the radius of the sphere. If the error between the radius and the distance to the center is minimized, the results are as follows.

$$P = \sum_{n=1}^{N} \left[ R - \sqrt{(a-x_n)^2 + (b-y_n)^2 + (c-z_n)^2} \right]^2 \quad (9)$$

$$\frac{dP}{dR} = 2 \cdot N \cdot R - 2 \cdot \sum_{n=1}^{N} \sqrt{(a-x_n)^2 + (b-y_n)^2 + (c-z_n)^2} \quad (10)$$

$$R = \frac{1}{N} \cdot \sum_{n=1}^{N} \sqrt{(a-x_n)^2 + (b-y_n)^2 + (c-z_n)^2} \quad (11)$$

The above equation has issues in that if the center (a, b, c) changes, then the set of data to recompute the radius would have to be stored. Another method would be to take the average of the square distance for the radius squared $$R^2 = \frac{1}{N} \cdot \sum_{n=1}^{N} [(x_n - a)^2 + (y_n - b)^2 + (z_n - c)^2] \quad (12)$$

which allows keeping the running sums as described above when the center of the sphere was computed:

$$R^2 = \frac{1}{N} \cdot \left[ \sum_{n=1}^{N} [(x_n)^2] - 2 \cdot a \cdot \sum_{n=1}^{N} x_n + N \cdot a^2 + \sum_{n=1}^{N} [(y_n)^2] - \right. \quad (13)$$
$$\left. 2 \cdot b \cdot \sum_{n=1}^{N} y_n + N \cdot b^2 + \sum_{n=1}^{N} [(x_n)^2] - 2 \cdot c \cdot \sum_{n=1}^{N} z_n + N \cdot c^2 \right]$$

Given the radius squared, we simply take the square root to obtain the radius.

Evaluating Results

It must be determined how well the measurements can be trusted and if the measurements have been corrupted with a magnetic disturbance. Because the user may move the sensors near extraneous magnetic fields, the magnetometer measurements cannot be relied on. If the magnetometer measurements cannot be trusted, then the magnetometer bias cannot be computed. In the next section, several metrics will be described that can be used together to determine how accurate the bias computation is. Any combination of the listed metrics could be used.

Minimizing Term

The basis for finding the magnetometer bias was to minimize the S term above and below. If the measured magnetometer data is not very spherical, the minimization will be larger. To find out how well the estimate has measured the center of the circle, the value can be computed which it originally tried to minimize. The equations can be reduced to single sums as was the case when computing the partial derivatives. Applying the double sum to single sum identity twenty-one times results in a single sum equation to compute S. Matlab code canto compute S is shown below. The Matlab code takes the magnetometer data (x, y, z) and the bias or center of the spherical fit (a, b, c), then returns S, the term that was minimized. The running sums are done at the beginning of the function, then S is computed. The Matlab program is for illustrative purposes only and could be implemented in a manner that would use running sums and not need a vector of data (x, y, z).

$$S = \sum_{n=1}^{N-1} \sum_{m=n+1}^{N} \left[ \begin{array}{c} \left[a - \frac{(x_m + x_n)}{2}\right] \cdot (x_m - x_n) + \left[b - \frac{(y_m + y_n)}{2}\right] \cdot \\ (y_m - y_n) + \left[c - \frac{(z_m + z_n)}{2}\right] \cdot (z_m - z_n) \end{array} \right]^2 \quad (14)$$

function s=centersum (x, y, z, a, b, c)
% a, b, c is the center of the sphere
% x, y, z 3D points.
% Computes the sum of the distance squared between the center point (a, b, c)
% and a plane created by a normal vector between pairs of points and the
% midpoint of the pairs of points.

$N$=length($x$);

$x1$=sum($x$);

$x2$=sum($x.*x$);

$x3$=sum($x.*x.*x$);

$x4$=sum($x.*x.*x.*x$);

$y1$=sum($y$);

$y2$=sum($y.*y$);

$y3$=sum($y.*y.*y$);

$y4$=sum($y.*y.*y.*y$);

$z1$=sum($z$);

$z2$=sum($z.*z$);

$z3$=sum($z.*z.*z$);

$z4$=sum($z.*z.*z.*z$);

$x1y1$=sum($x.*y$);

$x1z1$=sum($x.*z$);

$y1z1$=sum($y.*z$);

$x1y2$=sum($x.*y.*y$);

$x1z2$=sum($x.*z.*z$);

$y1z2=\text{sum}(y.*z.*z)$;

$x2y1=\text{sum}(x.*x.*y)$;

$x2z1=\text{sum}(x.*x.*z)$;

$y2z1=\text{sum}(y.*y.*z)$;

$x2y2=\text{sum}(x.*x.*y.*y)$;

$x2z2=\text{sum}(x.*x.*z.*z)$;

$y2z2=\text{sum}(y.*y.*z.*z)$;

$s=N*a\hat{}2*x2-a\hat{}2*x1\hat{}2$;

$s=s-N*a*x3+a*x2*x1$;

$s=s+2*N*a*b*x1y1-2*a*b*x1*y1$;

$s=s-N*a*x1y2+a*x1*y2$;

$s=s+2*N*a*c*x1z1-2*a*c*x1*z1$;

$s32\ s-N*a*x1z2+a*x1*z2$;

$s=s+0.25*N*x4-0.25*x2*x2$;

$s=s-N*b*x2y1+b*x2*y1$;

$s=s+0.5*N*x2y2-0.5*x2*y2$;

$s=s-N*c*x2z1+c*x2*z1$;

$s=s+0.5*N*x2z2-0.5*x2*z2$;

$s=s+N*b\hat{}2*y2-b\hat{}2*y1\hat{}2$;

$s=s-N*b*y3+b*y2*y1$;

$s=s+2*N*b*c*y1z1-2*b*c*y1*z1$;

$s=s-N*b*y1z2+b*y1*z2$;

$s=s+0.25*N*y4-0.25*y2*y2$;

$s=s-N*c*y2z1+c*y2*z1$;

$s=s+0.5*N*y2z2-0.5*y2*z2$;

$s=s+N*c\hat{}2*z2-c\hat{}2*z1\hat{}2$;

$s=s-N*c*z3+c*z2*z1$;

$s=s+0.25*N*z4-0.25*z2*z2$;

The S term can be normalized and used as a metric as to the quality of the center estimate by dividing by the number of pair combinations (N)(N−1)/2 and then taking the square root $$\sqrt{\frac{2 \cdot S}{N \cdot (N-1)}}.$$

The normalized value represents the average distance between the planes created by the pairs of points and the center of the sphere. The square root and multiplication by 2 can be avoided for CPU savings in many cases such as if it is used as a threshold. The metric is useful to know if the data that is being taken matches a circle. The noise of the magnetometer will affect the normalized value, so any threshold used will need to reflect that or be large enough for the worst case. Magnetic disturbances will also cause the normalized value to increase. Signals with a magnetic disturbance should not be used because these signals will lead to errors in the bias calculation. Magnetic disturbances are hard to predict. So the threshold will allow a metric to gauge whether the data collected was valid or disturbed with a magnetic disturbance. Once a set of data has been declared valid, each new sample can be evaluated to see how well it fits with the rest of the data. To perform this evaluation the previous value of S (before the normalization) is stored before the new sample and the value of S with the current sample. Then, divide by the number of points minus one and take the square root. Keeping the same units as before, $$\sqrt{\frac{S_N - S_{N-1}}{N-1}}$$

would be compared to a threshold. Similarly, the square root could be eliminated since the value before normalization is being compared to a constant. Further optimizations include multiplying the threshold by the divisor in these equations as multiplication is typically easier than division.

Simulation

The metric S can be used so that it can be determined if the values have converged. It is difficult to know what the sensor has experienced enough user motion to converge. The functions used to solve a compass bias can be used to simulate in real time to determine how accurately the bias can be computed. The compass measurements will be simulated by computing orientation with gyroscopes and/or accelerometers. A constant field with noise added and a bias added will be converted to a compass measurement. When some or all of the constraints used to judge a convergence are noticed, it will be noticed if the actual measurements have appeared to converge. If convergence has not taken place then it is assumed that the data was corrupted with a magnetic disturbance, and the data will be thrown away and the process started over.

Data Range

While recording samples of magnetometer data, the minimum and maximum of each axis could be stored along with its companion axes values. Then it can be determined that minimum and maximum values are far enough apart but not too far apart before calling the data converged. The difference of the max and min should not exceed twice the radius plus error terms. If the difference is too large, the difference can be called a magnetic disturbance. The data can be thrown way and the process will be restarted. Because the bias can be solved at any point in time, it is possible to see how large an angle is made using these maximums and minimums. One metric would be to take the dot product going from the center of the sphere to the maximum with the vector going from the center of the sphere to the minimum. If the dot product is negative, at least a 90 degree rotation along the perpendicular axis has been observed. The sign of the dot product could be used for all axes, but in practice two out of three seems to work well enough and give enough observability to come up with a reasonable magnetometer bias. A smaller angle than 90 degrees could also be allowed using trigonometry.

Eigenvalue

A metric that works well that tracks convergence is looking at the minimum eigenvalue of the matrix in Equation 8. However, this metric is difficult to meet and typically not used.

Constant Bias

Another metric is used to determine there is a good estimate of the magnetometer bias is if the magnetometer bias stays within a small range for a period of time.

Bias Changing

One problem is to address what to do if the magnetometer bias changes. For example, if the magnetometer was in a phone and someone attached a magnetic faceplate to the phone for decoration, the magnetometer bias would change. After the data has converged, the parameters are kept for a second set of data. Data is added to the solved for set, if $$\sqrt{\frac{S_N - S_{N-1}}{N-1}}$$

is below a threshold (could remove the square root), then the data is added to the old data set. Data is always added to the new data set. After the new data set meets convergence as the first data set had to go through, it will be determined how many points were added to the old data set. If a small amount of points were added to the new data set and the bias has moved, the new data set will be used as the set to compute the bias, and the old data thrown. In either case, new magnetometer data will be collected into a new data set.

To avoid numerical issues with the data set, after a set number of data points is determined, all the data is divided by a constant, including the number of points. Mixing of data could also be performed in similar to the way a filter mixes data from different time samples.

Distance to Center

Another quality metric could be how far the data point is from the center of the circle. The data should be within the computed radius and errors.

Solving for Ellipsoids

The above equations are written for spheres. If the sensitivity of the magnetometer differs on each axis, the resulting shape would be an ellipsoid. If the sensitivity is different on each axis, each axis could be scaled by the required constant to make it a sphere. The algorithm requires the sensitivity to be the same along each of the 3 axes. Instead of trying to solve for each sensitivity adjustment, the adjustment could just assume 1 for one axis and solve for the other two. The computation is simpler if the scale factor is applied to both the magnetometer data and also the bias solved for.

Below is the minimum with scale factors on x and z of sx and sz.

$$S = \left[\left[\left[sx \cdot a - \frac{sx \cdot (x_m + x_n)}{2}\right] \cdot (x_m - x_n) \cdot sx + \left[b - \frac{(y_m + y_n)}{2}\right] \cdot (y_m - y_n) + \left[sz \cdot c - \frac{sz \cdot (z_m + z_n)}{2}\right] \cdot (z_m - z_n) \cdot sz\right]^2\right] \quad (15)$$

Examples of the derivatives which are set to zero are shown in equations (16):

$$\frac{dS}{dsx} = \left[\begin{array}{c} -2 \cdot sx \cdot (x_m - x_n) \cdot (x_m - 2 \cdot a + x_n) \cdot \\ \left[a \cdot sx^2 \cdot x_m - \frac{sx^2 \cdot (x_m)^2}{2} + \frac{sx^2 \cdot (x_n)^2}{2} - a \cdot sx^2 \cdot x_n - \right. \\ \frac{sz^2 \cdot (z_m)^2}{2} + c \cdot sz^2 \cdot z_m + \frac{sz^2 \cdot (z_n)^2}{2} - c \cdot sz^2 \cdot z_n - \\ \left. \frac{(y_m)^2}{2} + b \cdot y_m + \frac{(y_n)^2}{2} - b \cdot y_n \right] \end{array}\right] \quad (16)$$

$$\frac{dS}{da} = \left[\begin{array}{c} 2 \cdot sx^2 (x_m - x_n) \cdot \\ \left[a \cdot sx^2 \cdot x_m - \frac{sx^2 \cdot (x_m)^2}{2} + \frac{sx^2 \cdot (x_n)^2}{2} - a \cdot sx^2 \cdot x_n - \right. \\ \frac{sz^2 \cdot (z_m)^2}{2} + c \cdot sz^2 \cdot z_m + \frac{sz^2 \cdot (z_n)^2}{2} - c \cdot sz^2 \cdot z_n - \\ \left. \frac{(y_m)^2}{2} + b \cdot y_m + \frac{(y_n)^2}{2} - b \cdot y_n \right] \end{array}\right]$$

The derivates are computed for b, c, and sz as was the case for equation 16 above. Then, equation 16 will be set to zero and be reduced as with the sphere case. The square of the scale factors $sx^2$ and $sz^2$ will be solved for in equation 16.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A computer implemented method of estimating a magnetometer bias for a device comprising:
    collecting magnetometer data from the device; and calculating using a computer a center of a shape of the magnetometer data as a result of minimization; wherein the magnetometer data is represented by data points, wherein the minimization is a derivative of a sum of weighted distances of pairs of data points, wherein each of the weighted distances is weighted based upon how far apart the pair of points are from each other;
    wherein the minimization of calculating the center of the shape further comprises:
    calculating a plurality of running sums of the magnetometer data; storing the plurality of running sums; storing a count of the number of terms in each of the running sums;
    and calculating the center of the shape and setting the estimated magnetometer bias to the center of the shape.

2. The computer implemented method of claim 1, wherein the shape comprises a sphere.

3. The computer implemented method of claim 1, wherein the shape comprises an ellipsoid.

4. The computer implemented method of claim 1, wherein the calculating comprises calculating a plurality of running sums of the magnetometer data, a plurality of running sums of the square of the magnetometer data, a plurality of running sums of the cube of the magnetometer data and a plurality of running sums of the cross products of the magnetometer data.

5. The computer implemented method of claim 1, which includes evaluating if the estimated bias is accurate.

6. The computer implemented method of claim 1, further comprises calculating a radius of the sphere utilizing the plurality of running sums.

7. The computer implemented method of claim 6, wherein the calculated plurality of running sums are normalized utilizing the minimization to establish a threshold.

8. The computer implemented method of claim 7, wherein the threshold can be utilized to determine if the estimated magnetometer bias has converged.

9. The computer implemented method of claim 6, wherein it is determined if a particular magnetometer data point is on the sphere based upon the computed minimization.

10. The computer implemented method of claim 1, wherein a data range can be utilized to track convergence of the magnetometer bias.

11. The computer implemented method of claim 1, wherein a minimum eigenvalue of a matrix is utilized to track convergence of the bias.

12. The computer implemented method of claim 1, which includes determining if the magnetometer bias remains within a predetermined range for a predetermined time period to track convergence of the bias.

13. The computer implemented method of claim 1, which excludes magnetometer data being used as part of the magnetometer bias calculation, based upon the absolute value of the average normalized magnetometer data being below a threshold.

14. The computer implemented method of claim 1, wherein the sum of the weighted distances comprises the sum of the weighted distances squared.

15. A device comprising:
a processor;
a magnetometer for providing magnetometer data;
and a memory coupled to the processor; wherein the memory receives the magnetometer data; wherein the memory includes an algorithm for estimating the bias of the magnetometer data; wherein the processor executes the algorithm to perform the following operations; calculating a center of a shape of the magnetometer data as a result of minimization; wherein the magnetometer data is represented by data points, wherein the minimization is a derivative of a sum of weighted distances of pairs of data points, wherein each of the weighted distances is weighted based upon how far apart the pairs of data points are from each other; wherein the minimization of calculating the center of the shape further comprises calculating a plurality of running sums of the magnetometer data; storing the plurality of running sums; storing a count of the number of terms in each of the running sums; and calculating the center of the shape and setting the estimated magnetometer bias to the center of the shape.

16. The device of claim 15, wherein the shape comprises a sphere.

17. The device of claim 16, wherein it is determined if a particular magnetometer data point is on the sphere based upon the computed minimization.

18. The device of claim 15, wherein the shape comprises an ellipsoid.

19. The device of claim 15, wherein calculating a plurality of running sums of the magnetometer data, a plurality of running sums of the square of the magnetometer data, a plurality of running sums of the cube of the magnetometer data and a plurality of running sums of the cross products of the magnetometer data.

20. The device of claim 15, wherein the minimization is computed utilizing the plurality of running sums.

21. The device of claim 20, further comprises calculating a radius of the sphere utilizing the plurality of running sums.

22. The device of claim 15, wherein the calculated plurality of running sums are normalized utilizing the minimization to establish a threshold.

23. The device of claim 22, wherein the threshold can be utilized to determine if the estimated magnetometer bias has converged.

24. The device of claim 15, wherein a data range can be utilized to track convergence of the magnetometer bias.

25. The device of claim 15, wherein a minimum eigenvalue of a matrix is utilized to track convergence of the bias.

26. The device of claim 15, which includes determining if the magnetometer bias remains within a predetermined range for a predetermined time period to track convergence of the bias.

27. The device of claim 15, wherein the device comprises any of a portable phone, laptop, tablet, notebook, and smartphone.

28. The device of claim 15, wherein the sum of the weighted distances comprises the sum of the weighted distances squared.

29. A non-transitory computer program product including a computer readable medium to be executed on a computer, the computer readable medium for performing the following operations comprising: collecting magnetometer data from the device; and calculating a center of a shape of the magnetometer data as a result of minimization; wherein the magnetometer data is represented by data points, wherein the minimization is a derivative of a sum of weighted distances of pairs of data points, wherein each of the weighted distances is weighted based upon how far apart the pairs of data points are from each other; wherein the minimization of calculating of a center of an the shape further comprises:
calculating a plurality of running sums of the magnetometer data; storing the plurality of running sums; storing a count of the number of terms of running sums; and calculating the bias from the stored running sums when the count of the plurality of running sums is less than a predetermined threshold.

30. The computer implemented method of claim 29, wherein the calculating comprises calculating a plurality of running sums of the magnetometer data, a plurality of running sums of the square of the magnetometer data, a plurality of running sums of the cube of the magnetometer data and a plurality of running sums of the cross products of the magnetometer data.

* * * * *